US007510895B2

(12) United States Patent
Raterman

(10) Patent No.: US 7,510,895 B2
(45) Date of Patent: Mar. 31, 2009

(54) INFERENTIAL TEMPERATURE CONTROL SYSTEM

(75) Inventor: John M. Raterman, Atlanta, GA (US)

(73) Assignee: Nordson Corporation, Westlake, OH (US)

(*) Notice: Subject to any disclaimer, the term of this patent is extended or adjusted under 35 U.S.C. 154(b) by 347 days.

(21) Appl. No.: 10/976,954

(22) Filed: Oct. 29, 2004

(65) Prior Publication Data

US 2006/0095157 A1 May 4, 2006

(51) Int. Cl.
*H01L 21/00* (2006.01)

(52) U.S. Cl. .............................. 438/54; 438/17; 438/18

(58) Field of Classification Search ................... 438/17, 438/18, 54; 118/666, 667; 156/66, 274.8, 156/275.7
See application file for complete search history.

(56) References Cited

U.S. PATENT DOCUMENTS

| | | | | |
|---|---|---|---|---|
| 4,328,387 | A | 5/1982 | Kemble | 219/517 |
| 4,545,504 | A | 10/1985 | Fabel et al. | |
| 4,600,124 | A | 7/1986 | Price | 222/54 |
| 4,716,520 | A * | 12/1987 | Locke et al. | 700/81 |
| 5,003,954 | A | 4/1991 | Yakuwa et al. | |
| 5,115,643 | A | 5/1992 | Hayata et al. | |
| 5,271,521 | A | 12/1993 | Noss et al. | 222/1 |
| 5,711,989 | A | 1/1998 | Ciardella et al. | 427/96 |
| 5,906,766 | A * | 5/1999 | Chaffin | 219/765 |
| 6,380,861 | B2 | 4/2002 | Estelle et al. | 340/588 |
| 6,541,304 | B1 * | 4/2003 | Bouras et al. | 438/108 |
| 6,955,946 | B2 * | 10/2005 | Bouras et al. | 438/108 |
| 2003/0137080 | A1 * | 7/2003 | Bouras et al. | 264/272.11 |
| 2006/0182887 | A1 * | 8/2006 | Miller | 427/256 |

FOREIGN PATENT DOCUMENTS

WO WO03037527 A1 5/2003

OTHER PUBLICATIONS

European Patent Office, European Search Report in Corresponding EP Application No. 05110203, Feb. 13, 2006, 5 pgs.

* cited by examiner

*Primary Examiner*—S. V Clark
(74) *Attorney, Agent, or Firm*—Wood, Herron & Evans LLP

(57) ABSTRACT

A system manages the temperature of thermoplastic material by initiating a default heating cycle in response to a sensor failure. The system may thus continue to heat the thermoplastic material according to the default heating cycle until the sensor can be repaired or replaced. A system controller implements the default heating cycle using a stored profile. That is, the controller causes a heating element to generate heat according to a default heating profile retrieved from a memory. The profile may be determined using historical heating data, user input and/or a factory setting.

16 Claims, 5 Drawing Sheets

INFERENTIAL TEMPERATURE CONTROL SYSTEM

FIELD OF THE INVENTION

This invention relates generally to systems used to manufacture products incorporating thermoplastic products, and more particularly, to systems that monitor the operation of sensors and other components during a thermoplastic heating application.

BACKGROUND OF THE INVENTION

Thermoplastic materials are used in a variety of industrial applications that include adhesive dispensing and heat sealing applications. Thermoplastic material is processed to produce, among numerous other products, diapers, shrink wrap packages, sanitary napkins and surgical drapes. The technology has evolved from the application of linear beads, or fibers of material and other spray patterns, to air assisted applications, such as spiral and melt-blown depositions of fibrous material.

A number of these and other industrial applications involve stringent regulation and maintenance of system temperatures to mitigate occurrences of over or under heating. Unregulated temperatures can lead to ineffective viscosities, wasted product and/or damaged equipment. In the extrusion of plastics, for example, heated thermoplastic material is conveyed through a suitable conduit to an extruder, and in hot melt adhesive dispensing systems, molten adhesive is conveyed from an adhesive reservoir to a dispenser. Heat sealing operations use crimping bars that seal longitudinal edges of mating thermoplastic film ends. In the case of shrink wrapping, a thermoplastic film is wrapped in tubular form about an article, which passes through a heated shrink tunnel where the thermoplastic film is shrunk around the article.

To monitor temperatures of the equipment and products within these and other thermoplastic applications, it is often desirable to position one or more sensors throughout the system. For instance, a temperature sensor may be positioned within a hot melt dispensing system to provide that a hose is maintained at a desired temperature, e.g., a temperature sufficient to maintain the adhesive in a molten condition as it flows between the reservoir manifold and the dispensers. The same is also true for the dispensers, manifold, and reservoir.

It is also desirable for related reasons to determine if the temperature sensors are open-circuited or short-circuited. Left uncorrected, undetected and/or unregulated temperatures resulting from a failed sensor will cause wasted product, as well as malfunctioning or damaged equipment. As a consequence, systems typically shut down production after a sensor or other component failure is detected. Production conventionally must remain stalled until maintenance can be performed on the failed or malfunctioning sensor. Production may cease for several hours until an operator replaces or repairs the faulty component(s).

A need therefore exists for an improved system for manufacturing products incorporating thermoplastic products.

SUMMARY OF THE INVENTION

The present invention provides a system that manages the temperature of thermoplastic material used in manufacturing by initiating a default heating cycle in response to a sensor failure. The system thus continues to heat the thermoplastic material according to the default heating cycle until, for instance, the faulty sensor, connective wiring and/or other sensor-related component can be repaired or replaced. This feature reduces the occurrence of unscheduled downtime.

A controller of one embodiment implements the default heating cycle using a stored profile. That is, the controller typically causes a heating element to generate heat according to a default heating profile retrieved from a memory. The default heating profile may, for instance, be determined using historical heating data, such as heating cycle data recorded over a steady state period of operation. The default heating profile of another embodiment is determined according to user input, which may include, for example, equipment and material specifications, in addition to operator estimates or desired profile cycle ratios. The controller of still another embodiment determines the default heating cycle by retrieving from memory a stored profile programmed at the factory or in the field. The default heating profile of another embodiment is generated on the fly according to a temperature sensed using a functioning sensor. That is, instead of retrieving a stored, predetermined profile from memory, the controller causes a heater to generate heat in response to real time temperature feedback from another sensor.

Various additional advantages, objects and features of the invention will become more readily apparent to those of ordinary skill in the art upon consideration of the following detailed description of embodiments taken in conjunction with the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
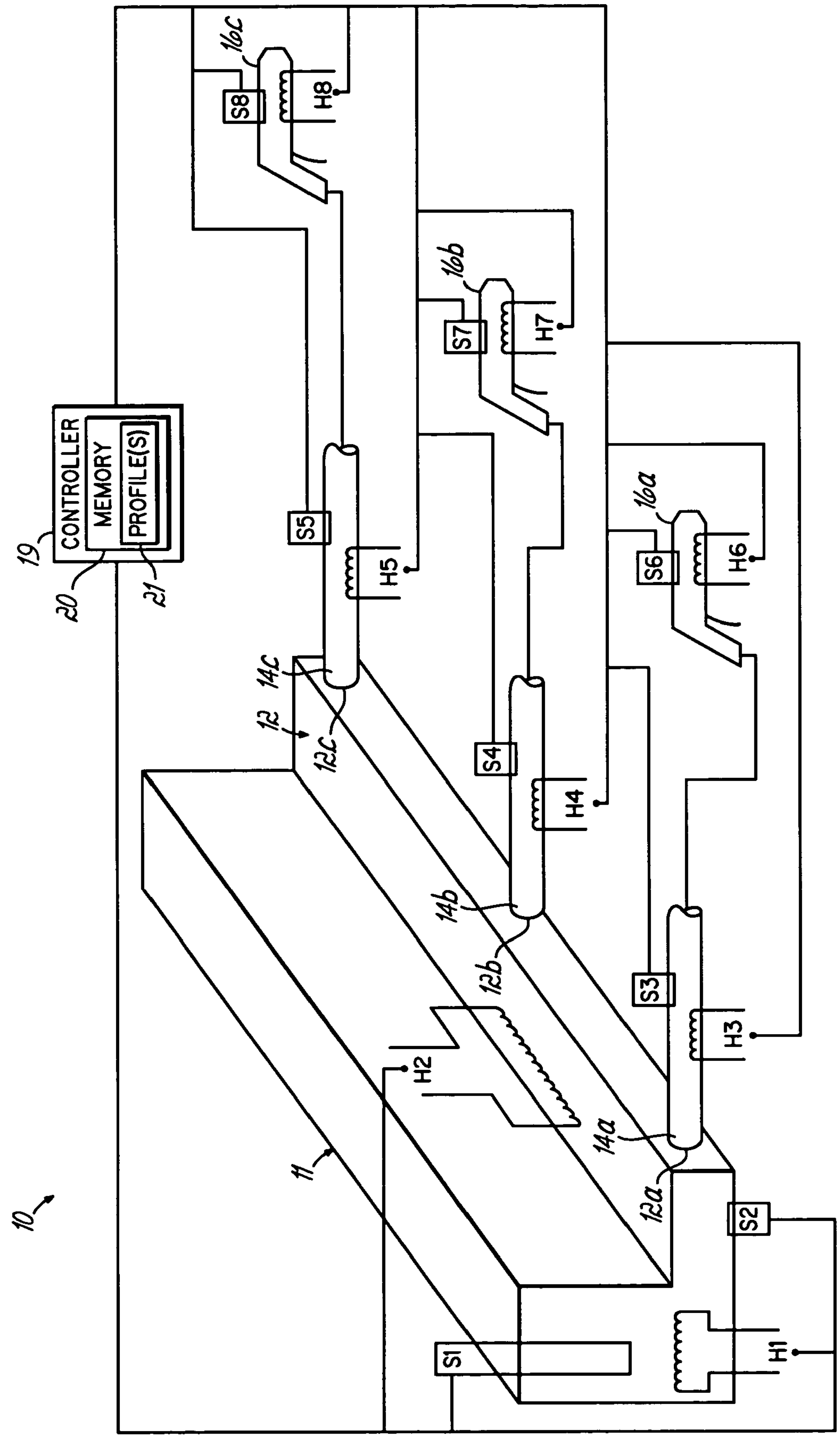
FIG. 1 is a typical hot melt heating and dispensing system configured to implement a default heating cycle in response to a detected component failure.

FIG. 1 illustrates a hot melt heating and dispensing system 10 configured to implement a default heating cycle in response to a detected component failure. More particularly as shown in FIG. 1, the system 10 includes a tank, or reservoir 11. The reservoir 11 is fluidly coupled to a manifold 12 for distributing the liquefied thermoplastic material such as a hot melt adhesive. One or more heated hoses 14*a-c* may be attached to the manifold and to a respective dispenser 16*a-c*.

The reservoir 11 is provided with a schematically depicted heater, or heater H1. Associated with the reservoir 11 is temperature sensor S1, also shown schematically. As with other heaters described herein, heater H1 may be configured such that it is incapable of causing the liquid to exceed the flash-point temperature of heated adhesive, should for instance, a switch or contact associated with the heater H1 become locked and incapable of turning off the heater.

The manifold 12 has several output ports 12*a*, 12*b*, 12*c*, etc. The manifold 12 is also provided with a heater H2 and an associated resistive temperature sensor S2 for monitoring and assisting in maintaining adhesive in the manifold 12 at the desired melt temperature. One or more pumps (not shown) may also be associated with the source reservoir 11 and/or manifold 12 for providing pressurized molten adhesive at the manifold output ports 12*a*, 12*b*, 12*c*, etc. in a known manner. If one or more pumps are provided, each pump may be provided with its own resistance heating element (not shown) and an associated temperature-sensing element (not shown).

Additional heaters H3-H8 may be employed in the hoses 14*a*, 14*b* and 14*c*, and their respective dispensers 16*a*, 16*b* and 16*c*. The heaters H3-H8 prevent cooling and the resultant solidification of the adhesive while it travels from the manifold to the dispenser outlet, or nozzle. As such, each dispenser, hose, and manifold may serve as separate locations along the hot melt adhesive flow path at which individual heaters under closed loop heater control are provided. To this end, the system 10 employs sensors S1-S8 associated with respective heaters H1-H8 to monitor temperature.

In one application, the temperature sensor S1 comprises a resistance temperature device (RTD). One skilled in the art will appreciate that other types of detecting elements may alternatively be used. For instance, a sensor for purposes of one embodiment may include an infrared sensor, while another sensor may comprise a thermocouple. Moreover, when the sensor is said to produce a feedback signal representative of a temperature of thermoplastic material, one skilled in the art will appreciate that such a temperature may include the temperature of equipment used to handle the thermoplastic material, e.g., a tank wall, hose core, ect. and not necessarily the actual temperature of the adhesive, itself.

Connected to the manifold output ports 12*a*, 12*b*, 12*c* is a hose 14*a*, 14*b*, and 14*c* that, at its other end, is connected to a selectively operable hot melt dispenser 16*a*, 16*b*, 16*c*, respectively. The hoses 14*a*, 14*b*, and 14*c*, as is well known in the art, contain heaters H3, H4, and H5, as well as associated sensors S3, S4, and S5, respectively. Similarly, the dispensers 16*a*, 16*b*, and 16*c* contain heaters H6, H7, and H8, respectively, and associated resistive temperature-sensing elements S6, S7, and S8, respectively.

A controller 19 for purposes of this specification typically includes a processor having access to a memory 20, which may be remotely located. A suitable controller may thus include a single microprocessor, a desk/laptop computer or a network in communication with a driver of a dispenser 16*a*. As such, the system controller 19 normally includes a keyboard, operator screen, or other user interface. With respect to the logical connectivity in FIG. 1, the controller 19 communicates with the heaters H1-H8 and sensors S1-S8. Such communication may be via a bus, a switching network, and/or may be wireless.

In general, the routines executed by the controller 19 to implement the embodiments of the invention, whether implemented as part of an operating system or a specific application, component, program, object, module or sequence of instructions, or even a subset thereof, will be referred to herein as "program code." Program code typically comprises one or more instructions that are resident at various times in various memory and storage devices in a controller, and that, when read and executed by one or more processors in a controller, cause that controller to perform the steps necessary to execute steps or elements embodying the various aspects of the invention. For instance, the controller 19 executes the program code to process one or more default heating profiles 21 stored within memory 21.

Moreover, while the invention is described in the context of fully functioning computers and other controllers, those skilled in the art will appreciate that the various embodiments of the invention are capable of being distributed as a program product in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature is used merely for convenience, and thus the invention should not be limited to use solely in any specific application identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, applications, applets, etc.), it should be appreciated that the invention is not limited to the specific organization and allocation of program functionality described herein.

Figure 2:
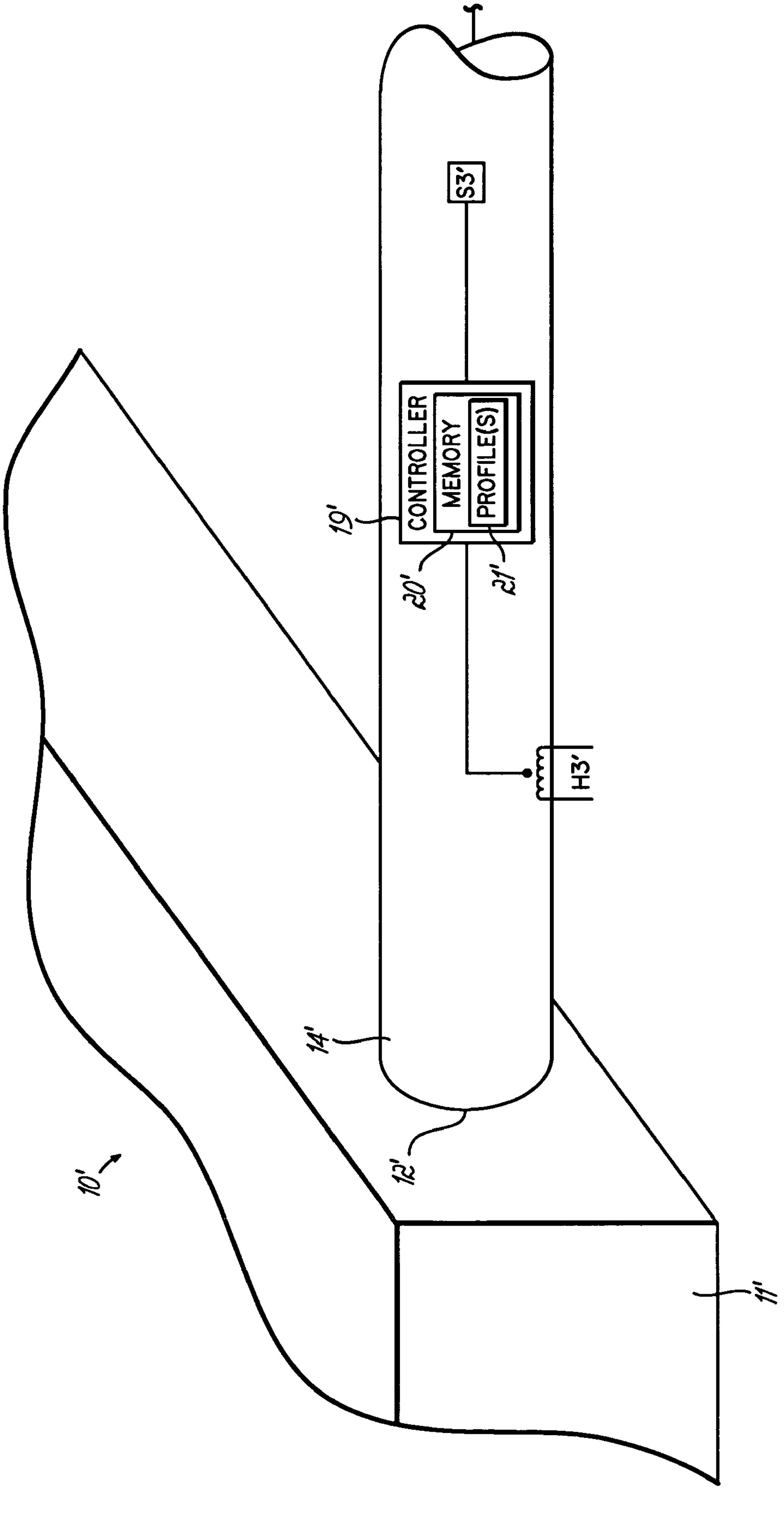
FIG. 2 shows a portion of another embodiment of a hot melt heating and dispensing system having a localized controller configured to implement a default heating cycle in response to a detected sensor failure.

FIG. 2 shows a reservoir 11', manifold 12', hose 14', as well as an associated heater H3', temperature sensor S3' and local controller 19' of another embodiment of a hot melt heating and dispensing system 10' configured to implement a default heating cycle in response to a detected component failure. Namely, the controller 19' of the hose 14' is configured to initiate heating by the heater H3', also of the hose 14', according to a default heating cycle. The controller 19' may activate the heater H3' as such in response to detecting a failure of the temperature sensor S3'.

Similar to the system 10 of FIG. 1, the lower portion of the reservoir 11' shown in FIG. 2 includes a manifold having an output port 12'. A hose 14' connects to the manifold output port 12' and a hot melt dispenser (not shown).

The controller 19' comprises a microprocessor positioned inside of the hose 14'. The controller 19' includes programming, memory 20', and a stored profile 21' useful to initiate a default duty cycle using the heater H3' in response to a failure of the sensor S3'. The controller 19' may comprise one of a number of similar controllers distributed throughout other hoses and equipment (not shown) of the system 10'. While the controller 19' shown in FIG. 2 may operate independently of any other controller in the system 10', the controller 19' may additionally communicate with another controller, such as a system controller analogous to the controller 19 shown in FIG. 1.

Those skilled in the art will recognize that the exemplary environments illustrated in FIGS. 1 and 2 are not intended to limit the present invention. Indeed, those skilled in the art will recognize that other alternative hardware and/or software environments may be used without departing from the scope of the invention.

Figure 3:
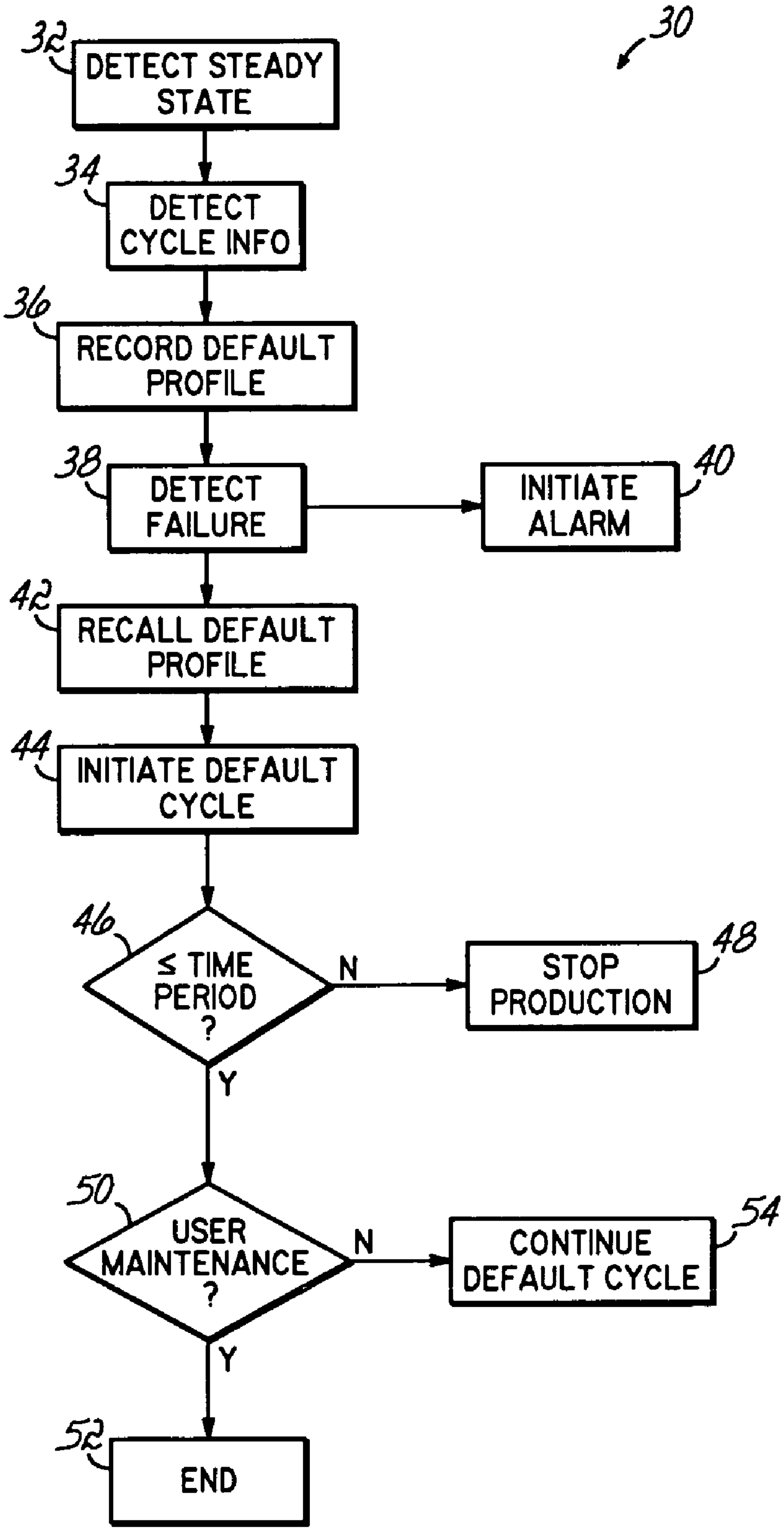
FIG. 3 shows a flowchart having an exemplary sequence of steps suited for execution by either of the respective controllers of FIGS. 1 and 2 for implementing a default heating cycle in response to a detected component failure.

FIG. 3 shows a flowchart 30 having an exemplary sequence of steps suited for execution by either of the respective controllers 19 and 19' of FIGS. 1 and 2. More particularly, the steps are configured to implement a default heating cycle in response to a detected component failure. Preliminarily at block 32 of FIG. 3, the controller 19 detects that the system 10 is operating in steady state. Steady state detection may include detection of an equipment status at which the system 10 has been operating at a stable level of production for some predetermined period of time. For instance, the controller 19 may determine that the system 10 is operating at a steady state condition by virtue of its having operated within specification or over a period of time. Another indicator used to determine steady state may relate to some performance related parameter, such as a number of units produced within specification.

By definition, this feature of detecting steady state status minimizes the effects of fluctuations attributable to starting, stopping, and other anomalies that could otherwise skew default cycle determinations. This feature operation during a steady state condition may additionally provide a source of heating cycle information that may be recorded and used to determine a profile used to construct a default heating cycle.

More particularly at block 34, the controller 19 detects heating control or heating cycle information during a steady state condition to determine the control, such as the heating duty cycle profile. Such a profile may include, for instance, a duty cycle, or ratio, of the heater established using information recorded while the system 10 operated in steady state. Such cycle information may include, for instance, a breakout or percentage of time during a production period that an individual or group of heaters were actively heating. For example, the controller 19 may have recorded cycle information indicating that it was necessary for a heater to be actively heating approximately 68 percent of a four hour period in order to maintain a desired adhesive temperature of 350 degrees Fahrenheit. As such, the controller 19 may determine that a default heating profile should cause the heater to actively heat 68 percent of the time and be off 32 percent of the time.

One skilled in the art will appreciate that the activity of the heaters as per the default profile will typically be advantageously staggered or otherwise distributed over a period of default operation to achieve the desired temperature. For instance, a 75% duty cycle will not likely translate into a heater being active for the first consecutive three hours of a four hour default period, and inactive for the remaining hour. The typical heater will instead be periodically activated at different intervals during the default operation. To this end, sensed duty cycle information may be correlated to a heater distribution scheme known to most efficiently activate heaters over time, while conforming to the bounds of the duty cycle. This scheme information will be associated with or otherwise included within the profile.

It will furthermore be appreciated that embodiments that compile averaged cycle information to create a default heating profile may accomplish the averaging according to any number of known methods. One such averaging technique includes moving averages, i.e., a mathematical average of a range of previous results, moving forward in a time frame. Updates to store profile data may be automatically accomplished to reflect trends over time indicated by moving averages. Moreover, other profiles may not be based on averaged data, but may instead include heater activation times that mirror actual times for a given production period that the heaters were previously active. For instance, if a heater was active for the first ten minutes of recorded production time and inactive for the next three minutes, then the profile may call for the heater to be active for the first ten minutes of default operation, then inactive for the next three minutes, and so on.

A profile for purposes of FIG. 3 thus typically includes information relating to the operation of the heater for a specified duration of time. One skilled in the art will appreciate that the length of that duration may be set according to operator preferences and system conditions. An exemplary duration may span virtually any time after the system reaches steady state. For instance, a suitable duration may include a two-week period beginning after the system began operating at full production, or steady state. Moreover, one skilled in the art will appreciate that other profiles may be determined for heater operation prior to reaching steady state. Such profiles may have particular application during startup, for example, and may include a feature that times the startup profile out after a certain in which the system would be expected to reach steady state. The system may then transition to another profile, accordingly.

One skilled in the art will appreciate that multiple such profiles may be established for each respective heater component. For instance, different profile data may be recorded and stored in logical association with an individual heater component. As such, when the detection of a sensor failure associated with a particular heater is accomplished, the profile particular to that heater will be automatically recalled and implemented as a default cycle at blocks 42 and 44, respectively.

Furthermore, processes used at block 34 to determine the heater duty cycle may be accomplished when necessary by considering a number of factors, including the equipment used in the process, the time the heater operated, the zone, and the time the heater was off. Such a heater duty cycle may be recorded at block 36 and comprise a default heater profile.

One skilled in the art will furthermore appreciate that the duty cycle data used to determine a default profile may be augmented where desired. For instance, in the case where a profile includes stored cycle data, the respective on and off times of the recorded cycle may be adjusted to reflect an additional operating consideration. For example, the on time of the duty cycle data detected at block 34 may be reduced by three percentage points to avoid overheating when recorded at block 36 as part of the profile.

The controller 19 at block 38 of FIG. 2 may determine that a failure of a temperature sensor has occurred. Detection of a sensor failure may be accomplished as is known in the art by a short circuit detector. In response to the detected failure, the controller 19 initiates a sensory detectable alarm at block 40. Such an alarm may include the illumination of a light emitting diode (LED) configured to apprise an operator as to the failed state of the sensor. Another suitable alarm may include an audible alarm and/or an email communicated to an operator.

Detection of a sensor failure would conventionally cause the system to shutdown for maintenance. In response to the detected failure at block 38 of FIG. 3, however, the controller 19 retrieves from memory 20 at block 42 the heating cycle profile recorded at block 36.

Using the retrieved profile 21, the controller 19 initiates implementation of the default cycle at block 44. That is, the respective heaters of the system 10 are made to heat the fluid according to the cycle profile stored at block 36. Such a default cycle may be identical to and/or will largely track the heating cycle data recorded to determine the profile at block 34. Continuing with the above example, a particular heater may be activated such that it actively heats 68 percent of every hour or other period beginning with the implementation of the default cycle at block 44. This feature allows production to continue in much the same manner as before the detected failure at block 38 and until the faulty sensor can be repaired or replaced.

As discussed herein, the default heating profile of another embodiment may be created dynamically, or on the fly. That is, the profile may be created according to temperatures sensed using a working sensor. More particularly, a program utilizing the profile is executed by the controller to cause a heater to generate heat in response to real time temperature feedback from another, functioning, temperature sensor. To this end, the controller may retrieve the program from memory, and may further cache or otherwise store the newly created cycle information or other operating parameters prior to initiating activation of the heater. In this manner, active heating is adjusted according to the temperature sensors that are working. For example, if the temperature sensor S1 in the reservoir 11 fails, and the temperature detected by sensor S3 of hose 14*a* is now five percent cooler, then the activity of the reservoir heater H1 may be increased proportionally by about five percent. One skilled in the art will appreciate that disproportionate heating ratios and schemes may be used where appropriate. The profile may additionally designate default sensors to be thus used in a manner analogous to backup sensors for a failed sensor.

Yet another embodiment similarly utilizes functioning sensors to compensate for a failed sensor. In so doing, the system capitalizes on a predictable and functional relationship between temperature controlled zones. As discussed herein, a zone may include a component, e.g., a hose, dispensor, tank, or grouping of different components. A zone typically includes an RTD or some other independent control mechanism that works in conjunction, or otherwise communicates with other zones of a system. The functional zone relationship typically concerns established temperature ratios between different zones. For instance, a temperature sensed in a first zone (comprising a hose 14*a* and an associated sensor S3) may historically be one tenth of one degree cooler than a second zone (comprising a reservoir 11 and an associated sensor S1). Such a relationship results from the proximity and exchange of common liquid thermoplastic material between the respective zones.

The temperature relationship may be automatically recorded at steady state in association with the zones, flow rate, specific heater of the material and/or other operating parameters as discussed herein. That is, historical information comprising a default heating profile and pertaining to the respective duty cycles of the zones may be used to heat a hose or other zone component to continue production until service is scheduled and performed. Continuing with the above example, the default profile, in response to a sensor S3 failure, may cause a heater H3 associated with the first zone to heat the thermoplastic material of the hose 14*a* to within one degree of a stored or real time temperature sensed by the sensor S1 of the second zone. The temperature of the material in the hose 14*a* may then be heated according to the predictable/functional relationship until the sensor S3 is replaced.

In another case, the operation of one zone having a failed sensor-related component may be made to mirror the operation of another zone having a functioning sensor-related component. Such a configuration may be advantageous where both zones historically function similarly. For instance, two hoses, each comprising a separate zone, may convey similar amounts of glue over a similar distance. If a sensor in the first hose fails, then a heating element in the first hose may be operated in accordance with the heating element of the second hose. As such, the system may retrieve a default profile that specifies that the heating element of the first hose should be slaved to the operation of the heating element of the second hose.

In any case, the controller 19 may allow production to continue according to the default cycle until the detection of an occurrence. Such an occurrence may include, for example, expiration of a time period at block 46. As such, production continues according to the default cycle until an end of a predetermined time period, for example, 8 hours, is detected at block 46. Thus, during the time period, production is continued while the heater operates according to the default cycle. At the end of the time period as detected by the controller 19 at block 46, the controller 19 provides a stop production signal at block 48. Production may likewise be paused in the event of another occurrence, such as the user deciding to replace the failed sensor or other component. In that event, the user stops production for maintenance as indicated at block 50.

Figure 4:
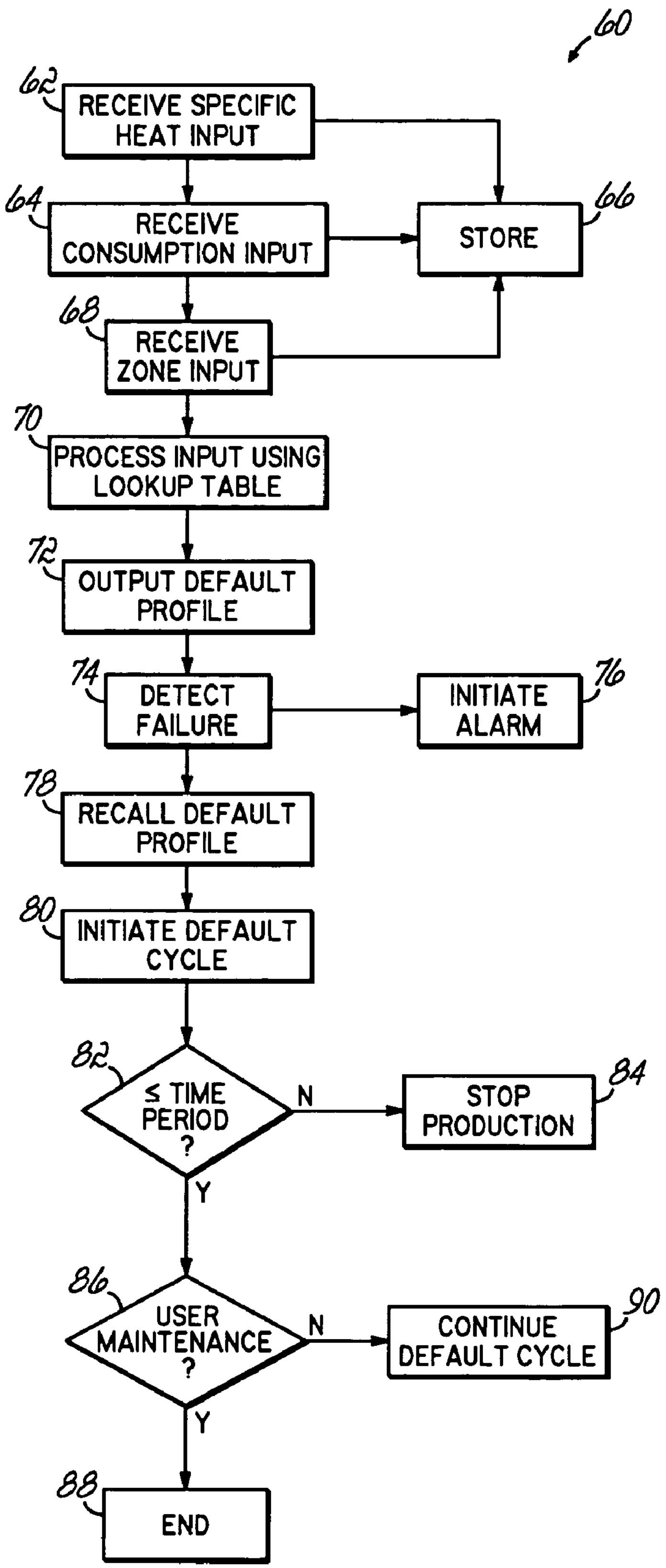
FIG. 4 shows exemplary steps taken by either of the respective controllers of FIGS. 1 and 2 for implementing a default heating cycle determined from user input.

The flowchart 60 of FIG. 4 shows exemplary steps taken by the controller 19 of FIG. 1 to establish and implement a default cycle in direct response to user input. More particularly as shown in the flowchart 60, the controller 19 receives a specific heat input from a user at block 62. Specific heat refers to an amount of heat required to change a unit mass of the dispensed adhesive by one degree Centigrade in temperature. The user may input the specific heat value of the adhesive using a keyboard, dial, switch or other known interface mechanism configured to communicate with the controller 19.

At block 64 of FIG. 4, the controller 19 may similarly receive consumption information input by the user. Exemplary consumption information may relate to the rate at which the molten adhesive is dispensed from a dispenser 16. Both the specific heat input and the consumption input may be recorded at block 66. Also recorded at block 66 may be zone information received by the controller 19 at block 68. Such zone information generally relates to the identification of particular hoses and gun types and/or groupings, as well as a PID constant useful in determining a default profile.

A technician manually enters the zone information according to one embodiment. In another, the information is automatically registered and otherwise communicated to the controller 19. Automatic registration is accomplished by incorporating into one component, e.g., a hose, a transponder or transmitter configured to communicate zone equipment information indicative of the hose to the controller. Continuing with the above example, the hose information could include the length and/or diameter of the hose. In the case where a transponder is embedded in the hose, a controller interrogates the transponder when the hose is installed, when a sensor fault is detected, or on some periodic basis.

The controller may use the hose information gleaned from the interrogation in a lookup table to determine a default profile. The system may thus store different profiles in association with different hose lengths and/or hose numbers, for instance. Where the hose information indicates that the hose is incompatible with a system requirement or default profile, then the controller initiates a warning or disables the inferential/default control. In this manner, an electronic handshake between the hose and the controller is achieved. Moreover, the system may use the handshake to automatically configure the default heating profile. One skilled in the art will appreciate that such automatic registration may be implemented as between any of the dispenser, tank, hose or other system components and/or zones.

The controller 19 may process at block 70 of FIG. 4 the input recorded at block 66 to determine a default cycle profile.

The determination of block 70 may include use of a lookup table correlating the information input at blocks 62, 64 and 68 to a respective profile. However, one skilled in the art will appreciate that there are a number of alternative methods useful in determining a profile, including those that use known algorithms executable by the controller 19. In any case, the default heating profile output at block 72 typically comprises a duty cycle or other operating parameter useful in implementing a default heater duty cycle.

The controller 19 at block 74 of FIG. 3 determines a further failure of a temperature sensor has occurred. Detection of a sensor failure may be accomplished by any manner known in the art as described earlier. In response to the detected failure, the controller 19 initiates an alarm at block 76, for example, by activating an LED, an audible alarm and/or an email communicated to an operator.

Further, in response to the detected failure at block 74 of FIG. 4, the controller 19 retrieves from memory at block 78 a heating cycle profile recorded at block 36. As discussed herein, the profile typically comprises a duty cycle or other indication of a how a heater should operate in order to achieve an expected temperature. Such operating parameters are derived, at least in part, from information input by the user at blocks 62, 64 and 68.

Using the retrieved default profile, the controller 19 initiates implementation of the default cycle at block 80. That is, the respective heaters H1-H8 of the system 10 are activated in order to heat the fluid according to the default cycle profile retrieved at block 78. For example, a particular heater H1 may be activated such that it actively heats 85 percent of every minute or other period beginning with the implementation of the default cycle at block 80. This feature allows production to continue in much the same manner as before the detected failure at block 74 and until the faulty sensor S1 can be repaired or replaced.

As shown in the embodiment of FIG. 4, the controller 19 may allow production to continue according to the default cycle until the expiration of a predetermined time period or user maintenance at blocks 82 and 86, respectively.

Figure 5:
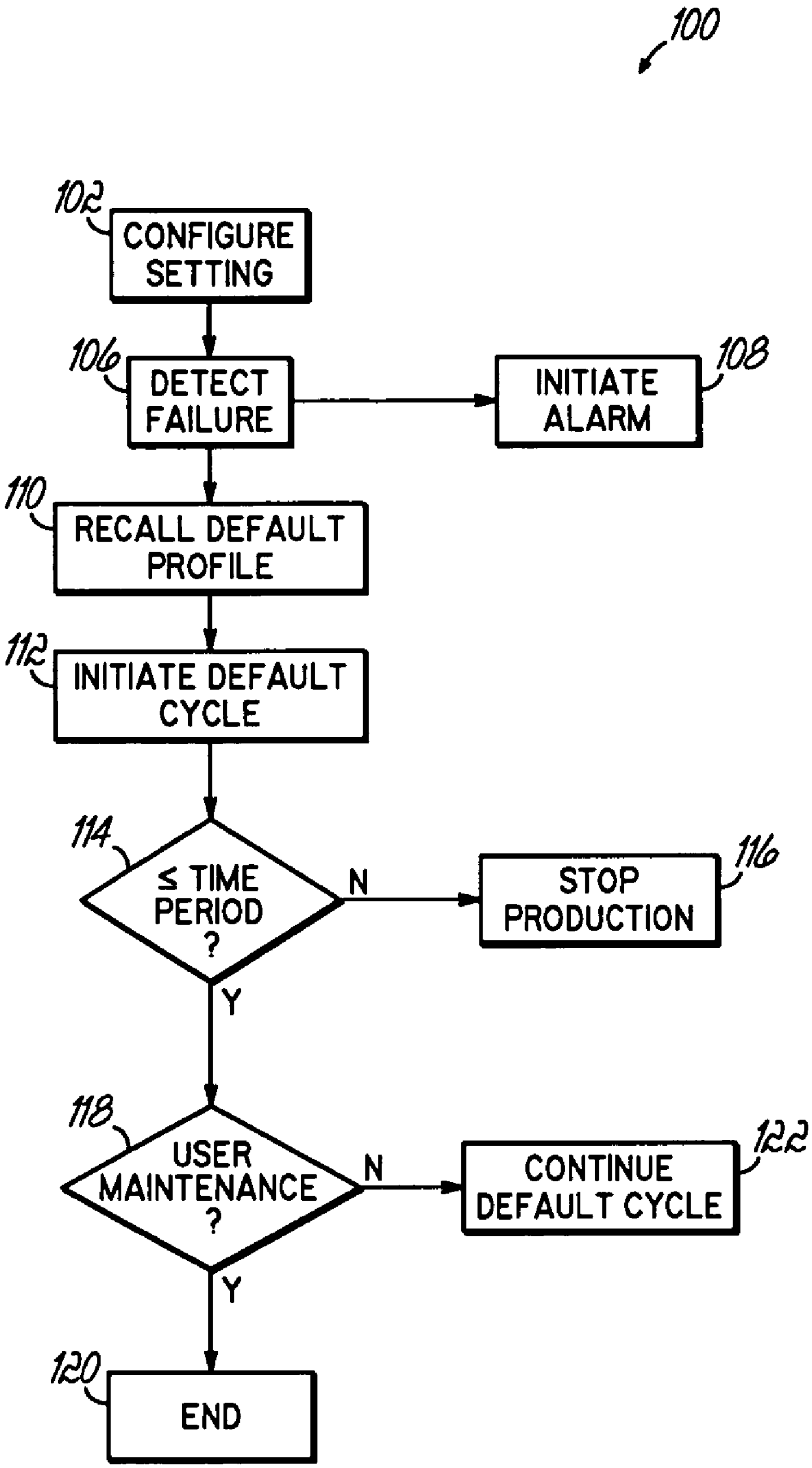
FIG. 5 shows exemplary steps taken by either of the respective controllers of FIGS. 1 and 2 for implementing a default heating cycle retrieved from a profile stored in memory accessible to the controller.

FIG. 5 shows a flowchart 100 having a sequence of steps configured to implement a default heating cycle according to a default profile stored on a controller, such as those shown in FIGS. 1 and 2. That is, one controller for purposes of the flowchart 100 may comprise a centralized 19 controller configured to initiate a default heating cycle in one or more heaters throughout a system such an embodiment is shown in FIG. 1. As discussed in the text describing FIG. 2, a separate localized controller 19' may be alternatively and/or additionally positioned within a reservoir, a manifold and/or each hose of an adhesive dispensing system. The controller 19' may be combined with or otherwise positioned proximate an associated temperature sensor S3'. As such, the controller 19' may in one sense comprise a remote controller particular to a heater component. In another sense, each controller of a system may function as an individual backup control system in the event of a sensor malfunction.

The controller 19' is configured to retrieve from accessible memory 20' a profile 21' that the controller 19' will use to activate its associated heater H3' in the event of a sensor S3' failure. As such, the controller 19' may be preprogrammed with settings specific to a flow rate for a particular heater H3', for instance. Turning more particularly to the flowchart 100, such settings that comprise the default profile 21' may be uploaded into an existing controller 19' at block 102. The profile 21' may alternatively be programmed into a microchip controller 19' as a factory setting. The profile 21' and programming used to implement the default cycle typically remains inactive within the system 10' until a failure is detected at block 106.

More particularly, if a sensor S3' fails within a system 10', the controller 19' associated with that sensor S3' and/or heater H3' assumes control until maintenance is performed. The controller 19' may prevent duty cycles above a given percentage, as well as in some cases prevent any temperature setup changes. To this end, memory of the controller 19' may include a table of default heater cycle times based upon adhesive flow rate, for instance.

Turning to block 106 of FIG. 4, the controller 19' may determine that a failure of a temperature sensor S3' has occurred. In response to the detected failure, the controller 19' initiates an alarm at block 108. An exemplary such an alarm may include an LED, an email or an audible alarm.

Failure of the sensor S1 within the hose 14' would conventionally cause the system 10' to shutdown for maintenance. In response to the detected failure at block 106 of FIG. 5, however, the controller 19' retrieves from memory at block 110 the stored heating cycle profile. As discussed herein, the profile 21' typically comprises a duty cycle or other indication of a how a heater should operate in order to achieve a desired temperature.

Using the retrieved profile 21', the controller 19' initiates implementation of the default cycle at block 112. That is, the associated heater H3' of the hose 14' is made to heat the fluid according to the cycle stored profile. This feature allows production to continue until the faulty sensor S3' can be repaired or replaced. More particularly, the controller 19' may allow production to continue according to the default cycle until the expiration of a predetermined time limit at block 114, or maintenance of the failed sensor S3' at block 118 interrupts production at block 118.

While the present invention has been illustrated by a description of various embodiments and while these embodiments have been described in considerable detail, it is not intended to restrict or in any way limit the scope of the appended claims to such detail. For instance, while a localized controller 19' as discussed in the text describing FIG. 5 may implement a default heating cycle according an uploaded, preset profile, one skilled in the art will appreciate that a localized controller of another embodiment may determine profile cycle times using recorded data as discussed in the text describing the processes of FIG. 3.

Additional advantages and modifications will readily appear to those skilled in the art. The invention in its broader aspects is therefore not limited to the specific details, representative apparatus and method, and illustrative example shown and described. For instance, a default heating profile in one embodiment of the invention may include a hardware or software current limiting feature configured to protect against overheating. Moreover, while features of the invention are description above primarily in the exemplary context of hot melt dispensing systems, one skilled in the art will appreciate that the features of implementing a default duty cycle may apply equally to other applications, including those involving the heating of a crimping bar or other component in a heat sealing or other operation. Still other uses may relate to blow molding, extruder, wax coater, roll coater, metal stamping die, ultrasonic welder and various other applications. Accordingly, departures may be made from such details without departing from the spirit or scope of the general inventive concept.

What is claimed is:

1. A method for controlling a heating element in a dispensing system configured to dispense a thermoplastic material, the method comprising:

heating a component of the dispensing system with a heating element;

measuring the temperature of the component of the dispensing system with a temperature sensor;

determining whether the temperature sensor has failed;

in response to determining that the temperature sensor has failed, retrieving a default heating profile stored by a controller that includes information that can used by the controller for operating the heating element; and operating the heating element according to the default heating profile to heat the component.

2. The method of claim 1, wherein retrieving the default heating profile includes retrieving historical heater duty cycle information.

3. The method of claim 2, wherein retrieving the default heating profile further includes retrieving the historical heater duty cycle information stored within a memory coupled with the controller.

4. The method of claim 1, wherein the default heating profile comprises sensed and averaged heater duty cycle information.

5. The method of claim 1, further comprising:

automatically updating the information used in operating the heating element.

6. The method of claim 1, wherein retrieving the default heating profile includes determining the default heating profile using a lookup table-that includes data associated with information comprising the default heating profile.

7. The method of claim 1, further comprising:

determining the default heating profile using user input.

8. The method of claim 7, wherein the user input used to determine the default heating profile is selected from the group consisting of heater cycle information, equipment specification information, zone information, adhesive specification information, and combinations thereof.

9. The method of claim 1, wherein the temperature sensor is a first temperature sensor, and further comprising:

determining the default heating profile using temperature data sensed by a second temperature sensor.

10. The method of claim 9, wherein operating the heating element according to the default heating profile includes dynamically adjusting the heat applied from the heating element to the component by the heating element according to the temperature data sensed by the second temperature sensor.

11. The method of claim 1, wherein determining whether the temperature sensor has failed further includes sensing a short circuit within the system.

12. The method of claim 1, wherein operating the heating element according to the default heating profile includes generating heat with the heating element according to the default heating profile until an interrupting event comprising at least one of an expiration of a time limit or operator intervention occurs.

13. The method of claim 1, further comprising:

determining the default heating profile using equipment identification information for identifying a system component to the controller of the system.

14. The method of claim 13, further comprising:

determining the default heating profile using a lookup table having the equipment identification information correlated to the default heating profile.

15. The method of claim 13, further comprising:

receiving the equipment identification information using at least one of user input and an automatic registration mechanism.

16. The method of claim 1, wherein the component is a manifold, a hose, a reservoir, or a manifold.

* * * * *

UNITED STATES PATENT AND TRADEMARK OFFICE

CERTIFICATE OF CORRECTION

PATENT NO. : 7,510,895 B2
APPLICATION NO. : 10/976954
DATED : March 31, 2009
INVENTOR(S) : John M. Raterman It is certified that error appears in the above-identified patent and that said Letters Patent is hereby corrected as shown below:

In column 6:
line 17, after “certain”, insert --duration--.

In column 9:
line 21, after “of”, delete “a”
line 47, after “system”, insert --:--.

In column 10:
line 16, after “exemplary”, delete “such an”
line 25, after “of”, delete “a”
line 44, after “according”, insert --to--.

In column 11:
line 12, Claim 1, after “can”, insert --be--
line 31, Claim 6, after “table” delete “-”.

In column 12:
line 34, Claim 16, after “is” delete “a manifold”.

Signed and Sealed this

Fifth Day of January, 2010

David J. Kappos

David J. Kappos
*Director of the United States Patent and Trademark Office*